United States Patent [19]

Pirani et al.

[11] Patent Number: 4,922,494
[45] Date of Patent: May 1, 1990

[54] METHOD OF AND CIRCUIT FOR DECODING BLOCK-CODED MESSAGES AFFECTED BY SYMBOL SUBSTITUTIONS, INSERTIONS AND DELETIONS

[75] Inventors: Giancarlo Pirani; Giorgio Taricco, both of Turin, Italy

[73] Assignee: CSELT (Centro Studi e Laboratori Telecomunicazioni S.p.A.), Turin, Italy

[21] Appl. No.: 191,206

[22] Filed: May 6, 1988

[30] Foreign Application Priority Data

May 20, 1987 [IT] Italy .............................. 67438 A/87

[51] Int. Cl.⁵ ............................................. G06F 11/10
[52] U.S. Cl. ..................................... 371/35; 371/37.1
[58] Field of Search ........................ 371/37, 38, 40, 41, 371/39, 42, 43, 44, 45, 46, 35

[56] References Cited

U.S. PATENT DOCUMENTS

| | | | |
|---|---|---|---|
| 4,654,854 | 3/1987 | Heppe | 371/43 |
| 4,675,870 | 6/1987 | Baggin | 371/35 |
| 4,718,066 | 1/1988 | Rogand | 371/35 |
| 4,805,174 | 2/1989 | Kubota | 371/43 |

Primary Examiner—Michael R. Fleming
Attorney, Agent, or Firm—Herbert Dubno

[57] ABSTRACT

A method is described for decoding messages coded as blocks consisting of a fixed number of symbols and affected by symbol substitutions, deletions and insertions, wherein for each received message having a length comprised within predetermined limits, a sequence of words (error frames) is generated which comprise all possible error combinations which can be corrected in the message. By using such error frames, a decoded word is generated for each frame, the probability that a decoded word actually is the transmitted word is calculated and the decoded word, whose probability value satisfies predetermined criteria, is emitted as a decoded message. A device for carrying out the method is also provided.

10 Claims, 4 Drawing Sheets

METHOD OF AND CIRCUIT FOR DECODING BLOCK-CODED MESSAGES AFFECTED BY SYMBOL SUBSTITUTIONS, INSERTIONS AND DELETIONS

FIELD OF THE INVENTION

Our present invention relates to a coded-signal transmission system and, more particularly, to a method of and a circuit for decoding messages coded as fixed-length blocks and affected by symbol substitutions, deletions and insertions.

Preferably, but not exclusively, said messages are speech messages and the invention is used in speech recognition systems, e.g. in systems based on transmission and subsequent decoding of messages formed by a sequence of digits.

BACKGROUND OF THE INVENTION

Systems of this kind can be used in modern telephone networks to allow authorized subscribers to have access to particular facilities, such as speech electronic mail, bank information, etc.. If the information obtainable by these facilities is confidential, the subscriber may have access to it only by pronouncing or dialing (or keying) his identification number, composed of a fixed number of digits, which can represent a word chosen out of a code. For various reasons, including line noises, symbol substitutions, deletions and insertions are possible and must be corrected during decoding.

In digital transmissions, it is common practice to use codes requiring transmission of sequences composed of a fixed number of symbols and allowing error correction by decoders at the receiving end, e.g., by exploiting redundancy symbols added to the information symbols and suitably computed: Reed-Soloman code is an example of such codes and characteristics are described, e.g. in the paper "*A Universal Reed-Soloman Decoder*", by R. Blahut, *IBM Journal of Research and Development*, Vol. 28, N. Mar. 2, 1984.

However, in digital transmissions, locations of possibly lost symbols can be identified by comparison with the noise level and symbol insertion is impossible (with the exception of catastrophic failures in timing systems). Hence known decoders are designed only to correct substitutions and fill erasures.

By contrast, for certain applications, including those envisages for the present invention, locations of lost symbols are not recognizable and, in addition, symbol insertions are possible. Hence known decoders cannot be used.

OBJECT OF THE INVENTION

The object of the invention is to provide a method and a circuit which, by converting symbol deletions and insertions into erasures, allow also messages affected by these kinds of errors to be decoded in conventional decoders.

SUMMARY OF THE INVENTION

The method according to the invention is characterized in that it comprises the steps of:

generating, for each message received with a length lying within predetermined limits, a sequence of words, hereinafter referred to as "error frames", comprising all the combinations of possible deletions and insertions in a message of that length, each word being composed of a number of symbols equal to said fixed number, each symbol indicating deletion or insertion error, or reception of a symbol in correspondence with a transmitted symbol;

obtaining from each message received, using said error frames, a decoded word for each error frame;

calculating the probability that a decoded word actually is the transmitted one;

emitting, as decoded message, the decoded word whose probability value satisfies predetermined criteria, or generating a request for retransmission, if no word satisfies such criteria.

The circuit for carrying out the method comprises a conventional channel decoder, and means controlled by the message length and arranged to generate and to forward to the channel decoder, if the length is comprised within predetermined limits, a sequence of words (error frames) comprising all the combinations of locations of deletions and insertions possible in a message of that length, each error frame comprising a number of symbols equal to said fixed number, each symbol indicating either deletion or insertion of symbols in the message received or yet reception of one symbol in correspondence with one transmitted symbol.

The channel decoder is arranged to emit, for each received message, a number of decoded words equal to the number of error frames and is followed by a computing circuit receiving such decoded words, the error frames and the message to be decoded and computing the probability that each decoded word is the transmitted word.

A selection logic is provided which, depending on the probability values, decides whether a decoded word, and which, is to be supplied to means utilizing the decoded message.

BRIEF DESCRIPTION OF THE DRAWING

The above objects, features and advantages of our invention will become more readily apparent from the following description, reference being made to the accompanying drawing in which.

SPECIFIC DESCRIPTION

Figure 1:
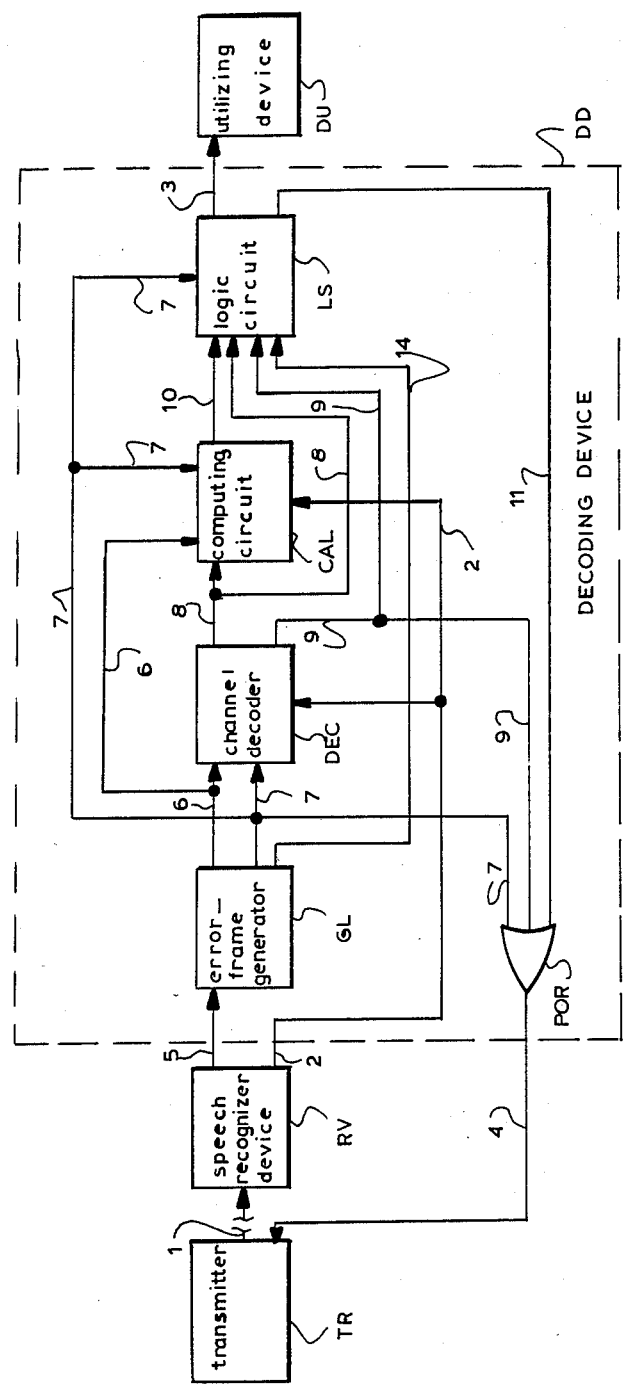
FIG. 1 is a block diagram of a speech message transmission system using the device according to the invention.

FIG. 1 is a speech message transmission system using the present invention and comprises a transmitter TR which sends on transmission line 1, more particularly, a telephone line, coded speech messages consisting of a fixed number of symbols, each symbol representing, for instance, one of digits 0 ... 9. Such messages can form a personal number allowing a subscriber to have access to a particular facility or utilizing device (speech electronic mail, etc.).

By way of example, we will suppose that each message constitutes a word of a shortened Reed-Solomon code, according to which messages are transmitted comprising eight symbols (four information symbols and four redundancy symbols). The alphabet of this code is a finite field of order 16 (the lowest power of two but not smaller than the number ten, of symbols used in the messages in the considered example); a subset of words of such a code is used, which words satisfy the constraint that the symbols contained therein (both information and redundancy symbols) belong to a subfield, containing ten elements, of the finite field above. Because of the algebraic properties of said Reed-Solomon code, the minimum Hamming distance d is five. As known, this means that it is possible to correct substitutions and erasures such that $2e + c \leq d - 1$, where $e =$ number of substitutions and $c =$ number of erasures. It is also to be noted that, taking into account the above statements, each code word ought to comprise 15 symbols; the seven unused symbols can be exploited in the reception phase to assist in error recognition.

The messages present on line 1 are received by a speech recognizer RV which, through connection 2, supplies decoding device DD, which is the subject matter of the invention, with the recognized symbol sequence. The way in which said symbols are transmitted on connection 2 depends on the type of speech recognizer and does not concern the present invention. For example, we assume that the recognizer supplies binary signals and that each symbol is represented by four bits. Device DD sends the messages that it was able to decode to utilization device DU through a connection 3. In case of decoding failure, DD asks the transmitter, for message retransmission through a signal transmitted on a wire 4.

To allow decoding of messages affected by symbol substitutions, deletions and insertions, the decoding device DD comprises:

an error-frame generator GE, which generates either word sequences comprising all the possible combinations of errors which can be corrected, or a signal inhibiting the other units in DD and requesting retransmission, each word comprising the same number of symbols as a code word, each symbol indicating, either symbol deletion or insertion in the message received or normal reception (one symbol received for one transmitted symbol); such words will be hereinafter referred to as "error frames";

The actual channel decoder DEC, which either generates a decoded word for each error frame or signals a decoding failure;

a device CAL calculating the probability that a decoded word is the transmitted word (word likelihood probability); and a selection logic LS deciding whether a word, and which, is to be forwarded to utilization device DU.

Error-frame generator GE is controlled by the length of the message received, supplied by recognizer RV through a connection 5. If the received message length is the same as that of the transmitted message or the length difference does not exceed a predetermined value, GE emits one of said word sequences (chosen according to such a length) on a first output 6, otherwise it emits on a second output 7 the signal disabling the other units in device DD and requesting message retransmission. To this aim, wire 7 is connected to an input of an OR gate POR, whose output is wire 4.

A possible embodiment of the error-frame generator GE will be described with reference to FIG. 2.

Channel decoder DEC receives the recognized message from the speech-recognition device RV, through connection 2, and the error frames from error-frame generator GE, through connection 6, and emits either the decoded words on a first output 8, or the signalling of decoding failure on a second output 9. Also wire 9 is connected to an input of gate POR. Since each error frame informs the decoder of a location affected by deletion or insertion errors, said errors will be considered as erasures and hence decoder DEC can be a conventional decoder for Reed-Solomon codes, able to correct substitutions and erasures and to signal decoding failures, of the type used for digital transmission and described in the cited paper.

Figure 3:
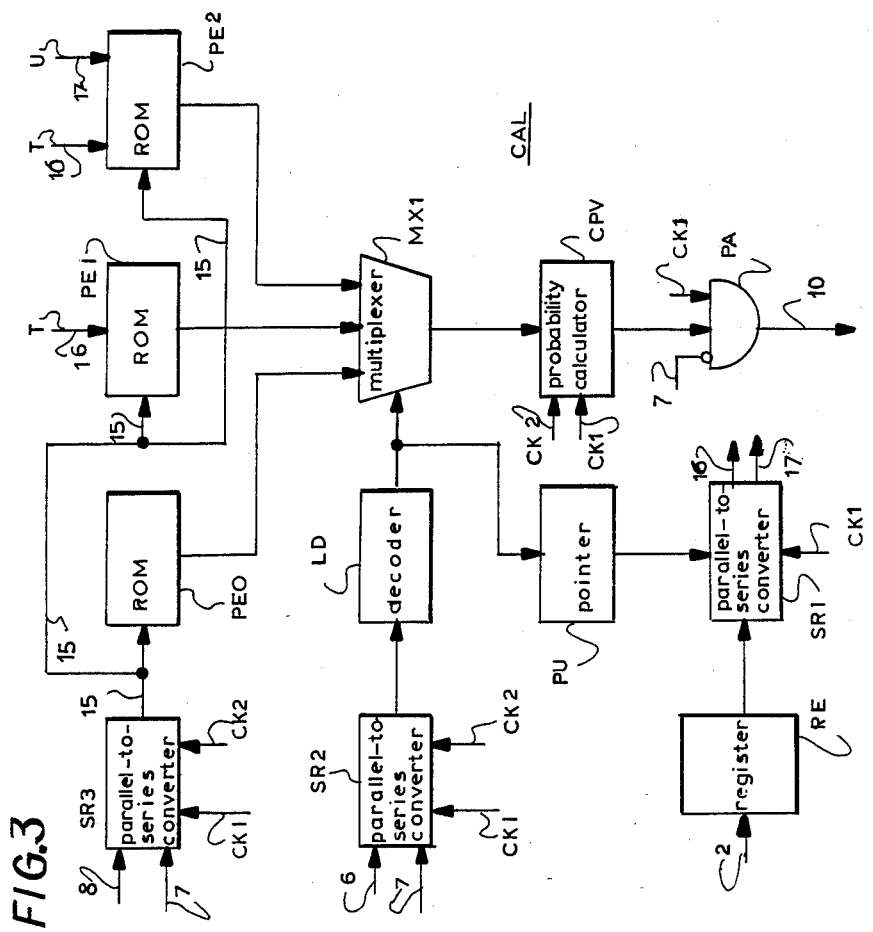
FIG. 3 is a block diagram of a likelihood probability computing circuit.

Device CAL receives the decoded words from decoder DEC and the corresponding error frames from GE error-frame generator, calculates the probability that a decoded word is actually the word transmitted by transmitter TR and supplies the selection logic LS with the calculated valve, via connection 10. The structure of the computing circuit CAL is shown in FIG. 3.

Logic LS receives the decoded words from decoder DEC and the likelihood probability from computing circuit CAL, and emits either the word whose likelihood probability satisfies predetermines criteria e.g. the word whose probability is maximum, provided that such a maximum is sufficiently different from the immediately lower values) or a retransmission request signal; that signal is presented on wire 11, connected to a further input of POR.

In the following detailed descriptions, the words on connections 2, 6, 8 are assumed to be transmitted in parallel.

Figure 2:
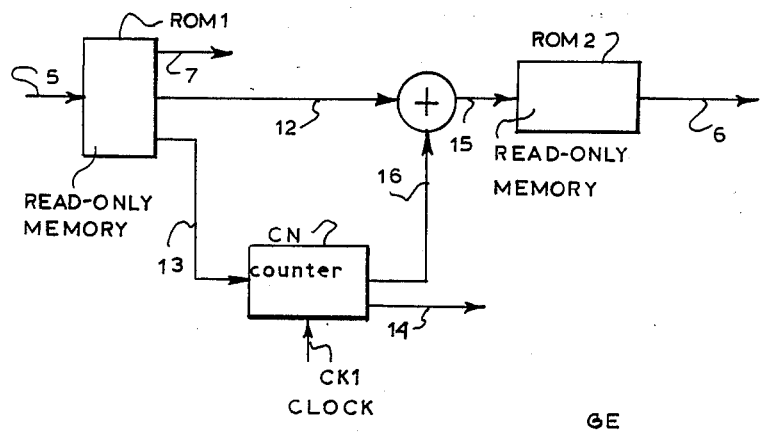
FIG. 2 is a block diagram of the error frame generator.

FIG. 2 shows an error-frame generator GE for the case in which words that can be decoded have a length ranging from 7 to 9 symbols, with at most one deletion and/or one insertion. This assumption is not very limiting, since simple calculations can prove that the probability of losing or adding more than one symbol when transmitting 8 symbols is very low. On the other hand, the decoding impossibility merely results in the necessity of requesting message retransmission and, owing to the kind of applications of the device, a slight increase in the probability of requesting retransmission is not very annoying for the subscribers.

Generator GE basically consists of a pair of read-only memories ROM1, ROM2. The first memory is addressed by the received word length and supplies:

the signal indicating length out of the range (wire 7), if such length is smaller than 7 or greater than 9;

the address of the first word to be read in ROM2 (connection 12) and the number N of words to be read (connection 13), if the length ranges from 7 to 9.

Memory ROM2 stores the error frames, which can be as listed in the following Table I:

TABLE I

| 1  | C X X X X X X X | 2  | X C X X X X X X |
|----|-----------------|----|-----------------|
| 3  | X X C X X X X X | 4  | X X X C X X X X |
| 5  | X X X X C X X X | 6  | X X X X X C X X |
| 7  | X X X X X X C X | 8  | X X X X X X X C |
| 9  | C X X X X X X I | 10 | C X X X X X I X |
| 11 | C X X X X I X X | 12 | C X X X I X X X |
| 13 | C X X I X X X X | 14 | C X I X X X X X |
| 15 | C I X X X X X X | 16 | X C X X X X X I |
| 17 | X C X X X X I X | 18 | X C X X X I X X |
| 19 | X C X X I X X X | 20 | X C X I X X X X |
| 21 | X C I X X X X X | 22 | X X C X X X X I |
| 23 | X X C X X X I X | 24 | X X C X X I X X |
| 25 | X X C X I X X X | 26 | X X C I X X X X |
| 27 | X X X C X X X I | 28 | X X X C X X I X |
| 29 | X X X C X I X X | 30 | X X X C I X X X |
| 31 | X X X X C X X I | 32 | X X X X C X I X |
| 33 | X X X X C I X X | 34 | X X X X X C X I |
| 35 | X X X X X C I X | 36 | X X X X X X C I |
| 37 | X X X X X X X X | 38 | X X X X X X I C |
| 39 | X X X X X I C X | 40 | X X X X I X C |

TABLE I-continued

| | | | | |
|---|---|---|---|---|
| 41 | X X X X I C X X | 42 | X X X X I X C X |
| 43 | X X X X I X X C | 44 | X X X I C X X X |
| 45 | X X X I C X X X | 46 | X X X I X X C X |
| 47 | X X X I X X X C | 48 | X X I C X X X X |
| 49 | X X I C X X X X | 50 | X X I X X C X X |
| 51 | X X I X X X C X | 52 | X X I X X X X C |
| 53 | X I C X X X X X | 54 | X I X C X X X X |
| 55 | X I X X X X C X | 56 | X I X X X C X X |
| 57 | X I X X X X C X | 58 | X I X X X X X C |
| 59 | I C X X X X X X | 60 | I X C X X X X X |
| 61 | I X X C X X X X | 62 | I X X X C X X X |
| 63 | I X X X X C X X | 64 | I X X X X X C X |
| 65 | I X X X X X X C | 66 | X X X X X X X I |
| 67 | X X X X X X I X | 68 | X X X X X I X X |
| 69 | X X X X I X X X | 70 | X X X I X X X X |
| 71 | X X I X X X X X | 72 | X I X X X X X X |
| 73 | I X X X X X X X | | |

In the table, C means deletion, I insertion, and X indicates the position of a normally received symbol (whether or not the symbol is correct). The first 8 words are emitted by GE if the received message comprises 7 symbols, the subsequent 57 words are emitted if the message comprises 8 symbols and the last 8 words are emitted if 9 symbols are received. It is to be noted that, owing to the code characteristics, a word containing a single substitution, if there are symbol deletions and/or insertions, or a word with two substitutions, in the absence of deletions and/or insertions, can be decoded.

In a conventional manner, the reading addresses for ROM2 are presented at output 15 of an arithmetic adder SM which receives the value present on connection 12 and the signal present on output 16 of a counter CN; the latter receives value N present on connection 13 and counts from 0 to N−1, upon command of a clock signal CK1. The carry-out signal of counter CN, present on wire 14, is used by selection logic LS (FIG. 1) to recognize the instant at which it is to decide whether or not a decoded word is to be forwarded to DU. Said signal can also be used to reset all circuits of device DD at the end of a message, so that DD can process a new message.

With reference to FIG. 3, the likelihood probability computing device CAL comprises three parallel-to-series converters SR1, SR2, SR3 loading, upon command of clock signal CK1, the message recognized by the speech-recognition device present on connection 2, the error frame present on connection 6, and the decoded word present on connection 8, respectively. The symbols of the words loaded into converters SR2, SR3 are sequentially emitted upon command of a clock signal CK2, having a period equal to ⅛ (one-eighth) of the period CK1; the symbols of the word stored in converter SR1 are on the contrary emitted in a way that depends on the error frame, as will be seen hereinafter. It is to be noted that 8 or 57 words, as the case may be, are to be successively loaded into converters SR2, SR3, whereas the same word is always to be loaded into converter SR1: thus SR1 will be preceded by a register RE which keeps the recognized word present for the whole time required to read the whole sequence of error frames from ROM2.

Output 15 of converter SR3 is connected to three read only memories PE0, PE1, PE2 which store probability matrices, conditioned on the transmitted symbol, of deletion, substitution or insertion error, respectively, for a given transmitted symbol. The ROM PE0 is addressed by symbol S present on output 15 of converter SR3, ROM PE1 is jointly addressed by S and by a symbol T of the word contained in converter SR1 (which symbol is presented on output 16), ROM PE2 is jointly addressed by S, T and by another symbol U of the word contained in converter SRI (which symbol is presented on output 17).

The outputs of said three memories are connected to the three inputs of a multiplexer MX1 which lets through the value read in the memories PE0, PE1 or PE2 according to whether, in correspondence with symbol S of the decoded word, the error frame symbol indicates deletion, normal reception or insertion. Multiplexer MX1 is controlled by a decoder LD which decodes the error frame symbols. The output signal of LD also serves as control signal for a pointer PU, associated with SRI, which acts so that no symbol, one symbol (T) or two symbols (T, U) of the received word are read from converter SR1, according to whether the error frame symbol indicates deletion, normal reception or insertion.

The output of multiplexer MX1 is connected to a device (Probability Calculator) CPV computing the likelihood probability of a word: e.g., if the actual error probability values are stored in PE0, PE1, PE2, CPV will be an accumulating multiplier, which is initialized to 1 correspondence with each decoded word (i.e. by signal CK1) and which, in correspondence with each symbol, multiplies the stored value by the error probability of the symbol itself. If, on the contrary, error probability logarithms are used, CPV will be an accumulating adder initialized to 0.

The output of the Probability Calculator CPV is connected to an input of an AND gate PA, which is enabled to transfer onto connection 10 the value accumulated in Probability Calculator CPV at the end of the computations relevant to each word (signal CK1). Of course, gate PA is enabled only in the absence of the signal on wire 7 indicating that the message received is out of the acceptable length range.

For a better understanding, the operation of the computing circuit CAL will be disclosed in the case of a received message containing 8 symbols; the description will be made referring to a decoded word obtained in correspondence with an error frame comprising all error types, e.g. frame 20 of Table I. References a1, b1, c1, d1, e1, f1, g1, h1 denote the symbols of the message recognized by RV, and a2, b2, c2, d2, e2, f2, g2, h2 the decoded word symbols. It will be assumed that memories PE0, PE1, PE2 store the actual probability values.

For the first symbol a2 of the decoded word, the error frame symbol is X (normal reception). LD causes the first symbol a1 of the message received to be presented on output 16 of register SR1 and causes the probability calculator CPV to become connected to memory PE1 through the multiplexer MX1. The calculator CPV multiplies the "1" initially present in its register by probability p1 (a1, a2) that symbol a2 is received as a1, and stores the result pv1. In correspondence with the second symbol b2 of the decoded word, the error frame symbol indicates a deletion. As a consequence, reading in converter SRI is disabled and multiplexer MX1 connects ROM PE0 with the calculator CPV, which multiplies the stored value pv1 by probability p0(b2) that symbol b2 has been lost and memorizes the new result pv2. In correspondence with the third decoded symbol c2, the error frame indicates again normal reception: LD makes pointer PU advance by 1, so that symbol b1 of the recognized message is presented at output 16 of register SR1. Multiplexer MX1 connects PE1 to CPV which multiplies pv2 by probability p1(b1, c2) that symbol c2 has been received as b1: a new partial value pv3 of likelihood probability is obtained and stored. The fourth error frame symbol indicates insertion: LD causes pointer PU to be incremented twice, so that SR1 presents symbol c1 on output 16 and symbol d1 on output 17, and multiplexer MX1 transfers to calculator CPV probability p2 (c1, d1, d2) that symbol d2 is received as the pair c1, d1. Calculator CPV multiplies pv3 by p2 obtaining a new value pv4. The remaining symbols or the error frame indicate again normal reception and hence they are processed like the first and third symbols. After processing of the eighth symbol, AND gate PA is enables by CK1 and transfers onto output 10 the likelihood probability P of the processed word. At the same time, CK1 resets to 1 the contents of calculator CPV and causes the loading into registers SR2, SR3 of the subsequent error frame and decoded word.

Figure 4:
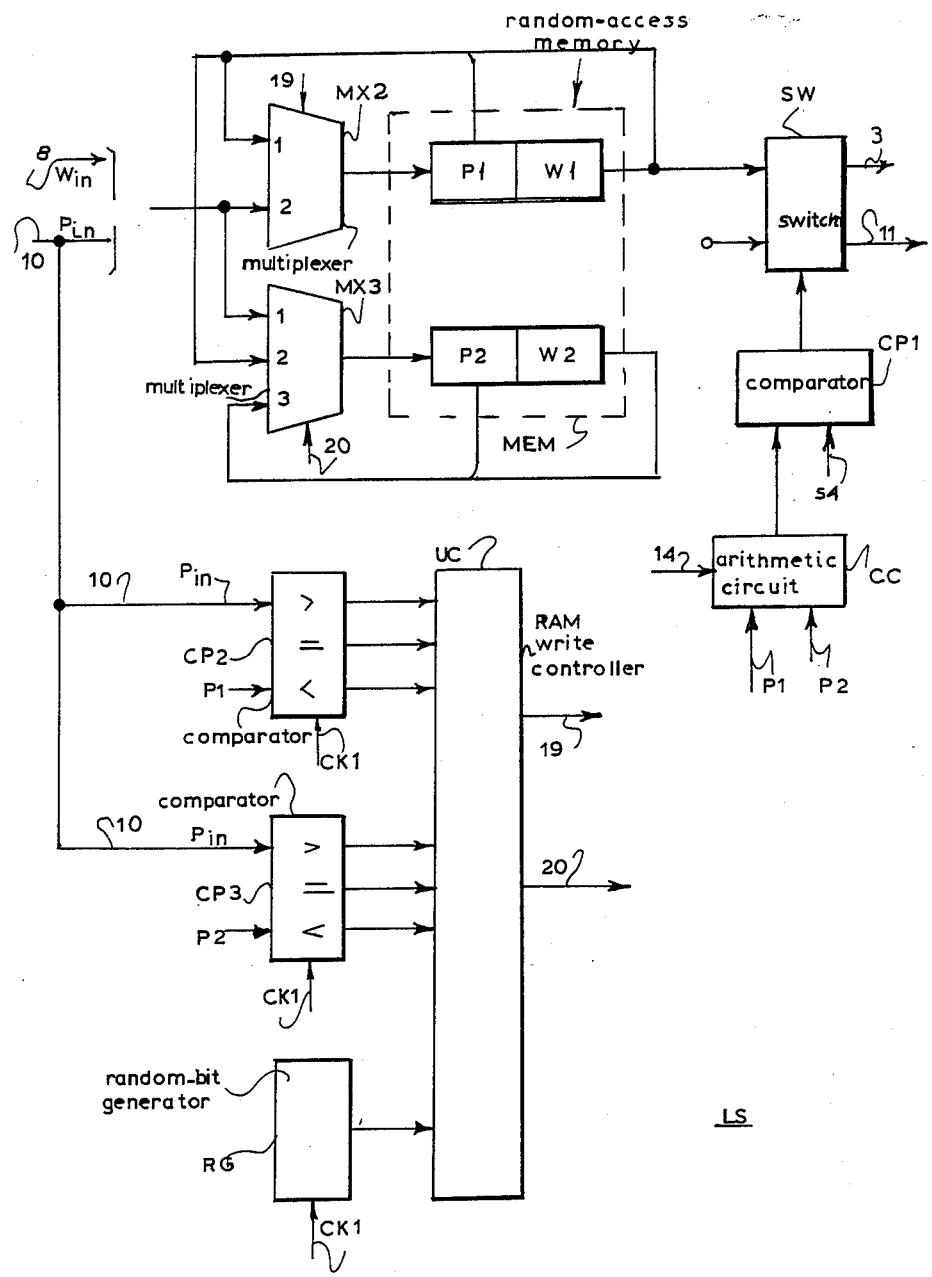
FIG. 4 is a block diagram of the selection logic.

FIG. 4 shows the selection logic LS. It is assumed that LS, receiving the sequence of decoded words relevant to a message recognized by recognition circuit RV (FIG. 1), stores only the two words with the greatest likelihood probabilities, and sends to utilizing device DU, at the sequence end, the word with maximum probability only if the probability, difference between the two words is not lower than a predetermined threshold. Selection logic LS comprises than a 2-position RAM memory MEM, storing in each position a decoded word and the relevant likelihood probability, and writing and reading control units which establish whether and in which location of REM a word arriving at LS is to be stored and, at the end of the sequence, whether a word is to be read or message retransmission is to be requested. Of course, the memory will be initialized to null likelihood probability values, to allow memorization of the first two words of the sequence, whatever their likelihood probabilities.

The following description is made under the hypothesis that likelihood probability P1 of word W1 stored in the first position of MEM is always greater than or equal to the likelihood probability P2 of word W2 stored in the second position, so that W1 is the word to be possibly forwarded to DU, Word W1 is transferred onto output 3 of the device through a switching unit SW which, alternatively, can connect wire 11 to a fixed logic level representing the retransmission request signal SW can be controlled by the output signal of a comparator CP1, comparing a threshold value SG with value P1/P2−1 computed by a circuit CC enabled by the carry-out signal of counter CN (FIG. 2), present on wire 14; comparator switch CP1 makes switch SW establish the connection between MEM and wire 3 if the value computed by CC is greater than or equal to the threshold, and the other connection in the opposite case.

For writing into either position of MEM a pair of multiplexers MX2, MX3 are provided, both having an input connected to connections 8, 10 conveying decoded words Win and probability values Pin, respectively. MX2 is a 2-input multiplexer, of which the other input is connected to the output of the first position of MEM, whereas MX3 is a 3-input multiplexer, of which the other input is connected to the output of the first position of MEM, whereas MX3 is a 3-input multiplexer, whose remaining two inputs are connected to the outputs of the two positions of the two positions of MEM, respectively. The multiplexers are controlled by signals present on outputs 19, 20 of a unit UC controlling writing into MEM. For the generation of such control signals, probability values P1, P2 present in MEM at the instant of arrival of a word Win (instant signalled by CK1) are fed to an input of two comparators CP2 and CP3, respectively, which receive at a second input value Pin present on connection 10 and compare Pin with P1 or P2, respectively.

The comparators indicate whether the values present at their two inputs are equal or different and, in the latter case, which of them is greater. The comparison result is supplied to two inputs (or input groups) of write controller unit UC. Write controller UC receives at a further input the bits generated by a random bit generator RG. These bits (hereinafter referred to as bits RAN) are generated at a rate equal to the frequency of CK1 and are used when Pin is equal to P1 or P2.

Figure 5:
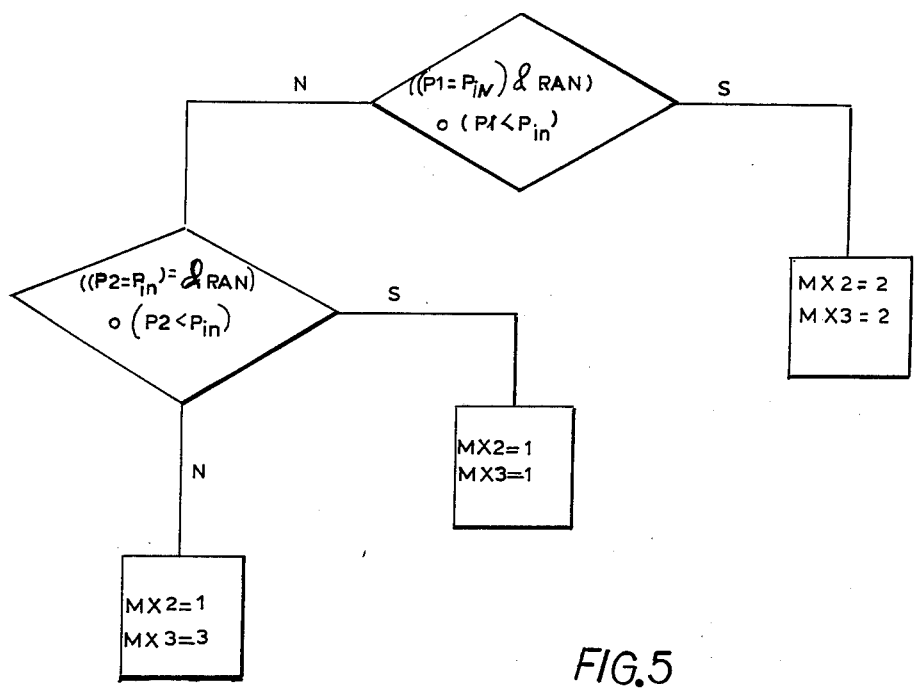
FIG. 5 is a flow chart of the operations of a circuit of the selection logic.

For each received word Win, write controller UC operates according to the following algorithm, shown in FIG. 5:

if Pin>Pi, or Pin=P1 and bit RAN is 1, both multiplexers MX2, MX3 are positioned on their second input, and hence Win and Pin are stored in position 1 of MEM, whereas the previous contents W1, P1 of the first position is transferred to position 2; if none of the preceding conditions has taken place, two solutions are possible:

(a) if Pin>P2, or Pin=P2 and bit RAN is 1, both multiplexers MX2, MX3 are positioned on their first input and hence Win and Pin are stored into position 2, while data W2, P2 previously stored therein are eliminated;

(b) if none of the conditions sub (a) occur MX2 is positioned on the first input and MX3 on the third, and hence Win and Pin are not memorized.

Of course, the input multiplexers of MEM and the comparators will be enabled only in the absence of a signal on wire 7, which signal has no longer been represented in FIG. 4 for simplicity sake.

The operation can be immediately deduced from the preceding description. The message transmitted by transmitter TR (FIG. 1) is recognized by recognition device RV and forwarded to decoder DEC and computing circuit CAL; at the same time the length of the message itself is communicated to error-frame generator GE. It can be supposed that the message comprises 8 symbols, as in the description of the operation of computing circuit CAL. Read only memory ROM1 (FIG. 2) receiving the information that the message comprises 8 symbols, indicates that 57 error frames, beginning with the ninth one, are to be read from read only memory ROM2, and the frames are emitted in succession on connection 6. in correspondence with each error frame, decoder DEC decodes the received message, considering each indication of deletion or insertion contained in the error frames as an erasure in the corresponding location of the received message, and supplies computing circuit CAL and selection logic LS with the 57decoded words. Computing circuit CAL calculates as described, the probability that each decoded word is the transmitted word and sends the probability values to selection logic LS. Unit LS, receiving the probability values and the decoded words, stores or does not store them according to the described algorithm. At the end of error frame emission by error-frame generator GE, the likelihood probability values of the two words present in memory MEM (FIG. 4) are analyzed to decide whether the word with the greatest likelihood probability is to be sent to the utilizing device as a decoded message.

Of course, message retransmission is requested whenever the received message length is beyond the limits or decoder DEC cannot decode the message or selection logic LS cannot select a word to be sent to utilization device DU. It is worth noticing that decoder DEC, in the decoding operation, considers also the symbols (seven, in the described example) which are not actually transmitted and which must all have a determined value, e.g. 0: possible violations of that law (which, if the whole code word were transmitted, would be considered as substitutions) give rise in the present case to a decoding failure and consequently, to the retransmission request; the probability of supplying a decoded message which does not correspond to the transmitted message is thus reduced.

It is clear that what has been described has been given only by way of non-limiting example and that variations and modifications are possible without going out of the scope of the invention. More particularly, different codes, different message lengths or even a different ratio between information and redundancy symbols can be used, or the correction of a different number of errors can be provided for; different algorithms can be used for the selection logic, etc.. Although the example described concerns speech message transmission, the invention can be applied to transmitted messages in the form of post-selection digits, by using the telephone dial or keyboard. This simply requires replacing detector RV by a recognizer of such digits.

We claim:

1. A method of decoding received messages coded as blocks of a fixed number of symbols and affected by symbol substitutions, deletions and insertions, said method comprising the steps of:
   (a) generating for each message received of a length lying in a predetermined range, a sequence of words forming error frames and comprised of all combinations of positions of possible deletions and insertions of a message of the said length, each said word being composed of a number of symbols equal to said fixed number, each symbol indicating at least one of the states:
   ($a_1$) deletion error, ($a_2$) insertion error, and ($a_3$) reception of a symbol in correspondence with a transmitted symbol;
   (b) decoding said words of each message received, using said error frames, to obtain a decoded word for each error frame;
   (c) calculating a value of a probability that each decoded word of step (b) is actually a word transmitted as the respective message; and
   thereafter selectively emitting as a decoded message the decoded word of step (b) whose probability calculated in step (c) satisfies predetermined criteria as to freedom from error and, if no word satisfies said criteria, generating a request for retransmission of the respective message.

2. The method defined in claim 1, further comprising the step of:
   generating said retransmission request when the received message length is out of said range.

3. The method defined in claim 1 wherein the word emitted has the maximum probability value of being the word transmitted as the respective message, provided the difference of the probability value of the word with the next lower probability is not less than a predetermined value.

4. The method defined in claim 1 wherein said messages are speech messages.

5. The method defined in claim 4 wherein each symbol of said message is one of the digits of the decimal number system.

6. A decoding circuit for decoding messages coded as blocks of a fixed number of symbols and affected by symbol substitutions, deletions and insertions, comprising:
   means for generating for each message received of a length lying in a predetermined range, a sequence of words forming error frames and comprised of all combinations of positions of possible deletions and insertions in a message of the said length, each said word being composed of a number of symbols equal to said fixed number, each symbol indicating at least one of the states:
   (a) deletion error, (b) insertion error, and (c) reception of a symbol in correspondence with a transmitted symbol;
   decoder means, connected to said means for generating, for decoding the words of each message received, using said error frames, to obtain a decoded word for each error frame;
   means, connected to said decoder means, for calculating a value of a probability that each decoded word is actually a word transmitted as the respective message; and
   means, connected to said means for calculating, for thereafter selectively emitting as a decoded message the decoded word whose probability as calculated satisfies predetermined criteria as to freedom from error and, if no word satisfies said criteria, generating a request for retransmission of the respective message.

7. The decoding circuit defined in claim 6 which comprises:
   a channel decoder receiving the messages to be decoded;
   an error-frame generator connected to an input of said channel decoder, controlled by the message length and generating and supplying to said channel decoder a sequence of words forming error frames comprising all of the possible combinations of locations of deletions and insertions and correct symbol positions for a message of a respective message length when the message length lies in a predetermined range, each error frame consisting of a number of symbols equal to said fixed number, each symbol indicating deletion or insertion of symbols of a received message or reception of a symbol in correspondence with a symbol of the respective transmitted message, said channel decoder emitting for each received message a number of decoded words equal to the number of error frames;
   a computing circuit connected to an output side of said channel decoder for receiving said decoded words, said error frames and the message to be decoded therefrom, said computing circuit calculating the probability that each of said decoded words is the transmitted word;
   a selection logic connected to said computing circuit, said channel decoder and said error-frame generator for deciding on the basis of calculated probability values which of the decoded words is to be emitted; and a utilization device connected to said selection logic for utilizing the decoded message.

8. The decoding circuit defined in claim 7 wherein said error-frame generator and said selection logic are so connected as to generate signals requesting retransmission of a message when the message to be decoded has a length which is outside said range and when no word can be forwarded to said utilization device corresponding to a received message, the retransmission-request signals disabling said channel decoder, said computing circuit and the selection logic.

9. The decoding circuit defined in claim 7 wherein said logic is connected and arranged to supply said utilization device with the decoded word for each received message which has the maximum probability of being the transmitted word provided that the difference of the probability value of the word with the next lower probability is not less than a predetermined value.

10. The decoding circuit defined in claim 7, further comprising:

a speech-recognition device receiving the received message and connected to an input side of said error-frame generator, said messages being speech messages, said speech-recognition device supplying said error-frame generator with information as to the length of a message received.

* * * * *